(12) United States Patent
Neidorff et al.

(10) Patent No.: US 12,066,459 B2
(45) Date of Patent: Aug. 20, 2024

(54) INTEGRATED CIRCUIT PACKAGE WITH CURRENT SENSE ELEMENT

(71) Applicant: Texas Instruments Incorporated, Dallas, TX (US)

(72) Inventors: Robert Allan Neidorff, Bedford, NH (US); Sreenivasan K Koduri, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 471 days.

(21) Appl. No.: 17/364,477

(22) Filed: Jun. 30, 2021

(65) Prior Publication Data

US 2022/0187337 A1    Jun. 16, 2022

Related U.S. Application Data

(60) Provisional application No. 63/123,575, filed on Dec. 10, 2020.

(51) Int. Cl.
  *G01R 1/067* (2006.01)
  *G01R 31/28* (2006.01)
  *H01L 23/495* (2006.01)

(52) U.S. Cl.
  CPC ...... *G01R 1/06711* (2013.01); *G01R 31/2851* (2013.01); *H01L 23/4952* (2013.01)

(58) Field of Classification Search
  None
  See application file for complete search history.

(56) References Cited

U.S. PATENT DOCUMENTS

| | | | | |
|---|---|---|---|---|
| 2010/0001382 A1* | 1/2010 | Udompanyavit | ..... | H01L 23/495 438/123 |
| 2013/0334662 A1* | 12/2013 | Jackson | .................. | H01L 28/20 257/536 |
| 2013/0334663 A1* | 12/2013 | Jackson | .................. | H01L 27/06 257/536 |

* cited by examiner

*Primary Examiner* — Michelle Mandala
*Assistant Examiner* — Jordan M Klein
(74) *Attorney, Agent, or Firm* — Charles F. Koch; Frank D. Cimino

(57) ABSTRACT

A semiconductor device includes a leadframe having a first level and a second level. The semiconductor device includes a semiconductor die and a conductive alloy. The conductive alloy is between the semiconductor die and the first level of the lead frame. The conductive alloy is configured to be a current sense element. The semiconductor device further includes a first conductive post coupling the semiconductor die to the conductive alloy, a second conductive post coupling the semiconductor die to the conductive alloy, and a third conductive post coupling the semiconductor die to the second level of the lead frame. The second conductive post is configured to be a first sense terminal. The third conductive post is configured to be a second sense terminal.

14 Claims, 7 Drawing Sheets

US 12,066,459 B2

INTEGRATED CIRCUIT PACKAGE WITH CURRENT SENSE ELEMENT

CROSS-REFERENCE TO RELATED APPLICATIONS

This application claims priority to U.S. Provisional Application No. 63/123,575, filed Dec. 10, 2020, which is hereby incorporated by reference.

BACKGROUND

A variety of electrical circuits include a current sense element. For example, a current sense element may be included to sense the current through a large power transistor. Some current system elements, however, have a relatively high temperature coefficient of resistance (TCR) which means the resistance of the sense element varies with temperature which, in turn, detrimentally impacts the accuracy of the current measurement with respect to temperature. Some current sense elements also change with age and thus a current sense element that is accurate at one point in time may not be accurate at a later point in time.

SUMMARY

In one example, a semiconductor device includes a leadframe having a first level and a second level. The semiconductor device includes a semiconductor die and a conductive alloy. The conductive alloy is between the semiconductor die and the first level of the lead frame. The conductive alloy is configured to be a current sense element. The semiconductor device further includes a first conductive post coupling the semiconductor die to the conductive alloy, a second conductive post coupling the semiconductor die to the conductive alloy, and a third conductive post coupling the semiconductor die to the second level of the lead frame. The second conductive post is configured to be a first sense terminal. The third conductive post is configured to be a second sense terminal.

In another example, a semiconductor includes a leadframe and a semiconductor die having a conductive alloy. The conductive alloy is configured to be a current sense element and includes at least copper and nickel. The first and second conductive posts couple the leadframe to the conductive alloy of the semiconductor die.

In yet another example, a semiconductor device includes a leadframe and a semiconductor die having a having a transistor. A current sense element is coupled between the leadframe and the transistor. The current sense element has a temperature coefficient of resistance in the range of approximately −0.00004/° C. to approximately 0.00004/° C.

BRIEF DESCRIPTION OF THE DRAWINGS

For a detailed description of various examples, reference will now be made to the accompanying drawings in which.

DETAILED DESCRIPTION

Figure 1:
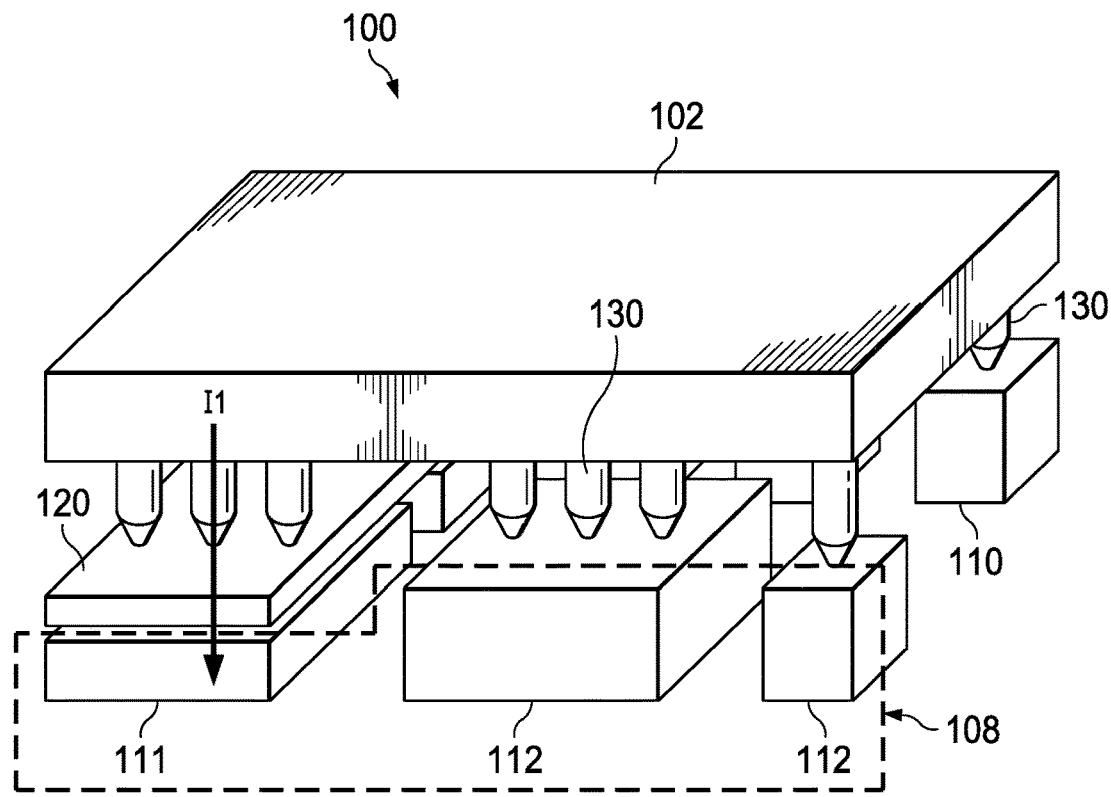
FIG. 1 is a semiconductor device in which a current sense element is coupled between a semiconductor die and a leadframe in accordance with an example.

FIG. 1 is a semiconductor device 100 that includes a current sense element 120 coupled between a semiconductor die 102 and a leadframe 108. The leadframe 108 is a multi-level leadframe. In the example of FIG. 1, the leadframe 108 is a two-level leadframe including a first level 111 and a second level 112. The second level 112 of leadframe 108 is taller than the first level 111 (as will be further explained with respect to FIG. 2). The current sense element 120 is coupled between the die 102 and the first level 111 of the leadframe.

The current sense element 120 comprises a material that has a relatively low temperature coefficient of resistance (TCR). Accordingly, the resistance of the current sense element 120 does not substantially change with respect to temperature. For example, the TCR of the current sense element is within a range that provides application-specific suitable accuracy for sensed current. In one example, the current sense element 120 provides less than 0.5% resistance change over a temperature range from 0° C. to 150° C. In an example, the current sense element 120 is an alloy that comprises copper, manganese, and nickel. One type of copper, manganese, and nickel alloy suitable as a current sense element is approximately 84.2% copper, approximately 12.1% manganese, and approximately 3.7% nickel, which is the case for an alloy referred to as MANGANIN®. The TCR of MANGANIN® is less than or equal to 0.000002/° C., which is several orders of magnitude lower than the TCR of copper (which has been used as a current sense element in other devices). In another example, the current sense element 120 is an alloy comprising copper and nickel. One type of copper/nickel suitable as a current sense element is approximately 55% copper and approximately 45% nickel. In one example, the current sense element has a TCR in the range of approximately −0.00004/° C. to approximately 0.00004/° C.

The semiconductor device 100 includes one or more conductive posts (e.g., copper) 130 that couples the die 102 to the current sense element 120, and one or more conductive posts 130 that couple the die 102 to the second level 112 of the leadframe 108. The current sense element 120 is electrically and mechanically attached to (e.g., soldered, welded, bonded, glued, etc.) the first level 111 of the leadframe 108. The current to be sensed, I1, flows in one direction indicated by the arrow of I1, or in the opposing direction, between the die 102 and the first level 111 of the leadframe through one or more of the conductive posts 130 and the current sense element 120. One or more others of the conductive posts 130 are coupled to sense contacts within the die 102 and are used by a circuit within the die to sense or otherwise measure the voltage developed across the current sense element 120 as a result of current I1. In one example, the current sense element is coupled to the die 102 in a four-terminal sensing configuration, also referred to as Kelvin sensing. Current through the current sense element 120 is supplied by a pair of "force" connections. The resulting voltage developed across the current sense element 120 is sensed by a pair of "sense" connections. Each force and sense connection is implemented by one or more of the conductive posts 130. For example, a given force or sense connection may comprise one or more than one post 130 coupled to the current sense element 120.

Because a relatively low TCR material is used as the current sense element, resistance of the current sense element advantageously changes correspondingly little with respect to temperature. Other types of current sense elements include a smaller transistor coupled in parallel with a larger transistor. The current through the smaller transistor is proportional to the current through the larger transistor. However, transistors may experience an aging mechanism called "trapped charge" which causes one or more characteristics of the transistor to change over time. Resistors are not substantially changed with electric field and thus do not have this aging mechanism. The resistance of resistor contacts, however, may change with age. The current sense elements described herein use force current paths that are separate from sense current paths thereby mitigating resistor contact aging.

While the example of FIG. 1 shows a single die 102 coupled to the current sense element 120, in another example, the current sense element 120 is coupled to more than one die. For example, a first semiconductor die could be connected to the force connections and a second die could be connected to the sense connections. In yet another example, three or more semiconductor dies could be included with one or more dies connected to force connections and one or more other dies connected to sense connections.

Figure 2:
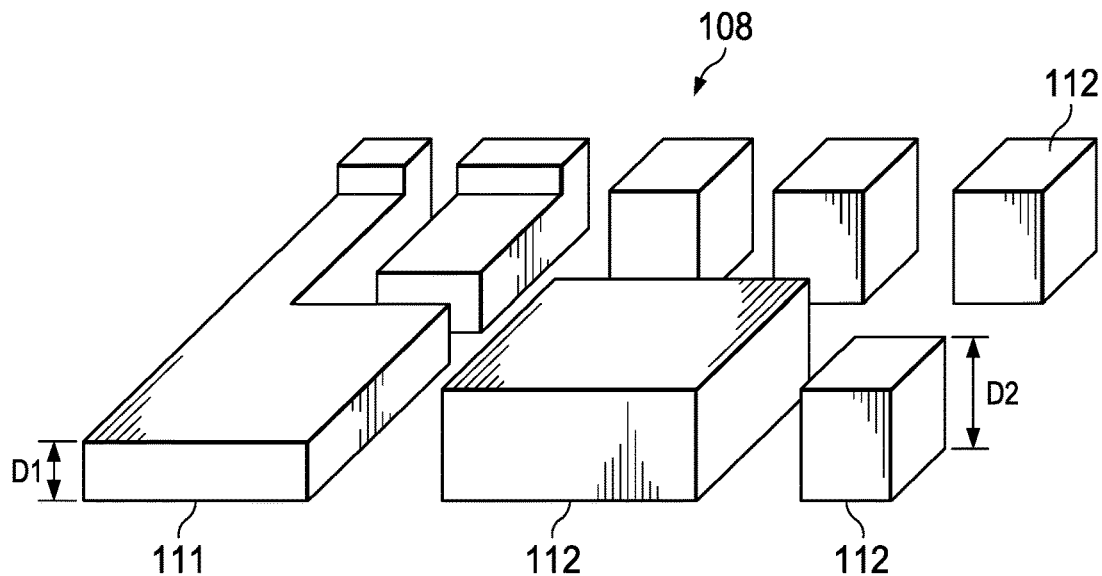
FIG. 2 is a multi-level leadframe usable for the semiconductor device of FIG. 1 in accordance with an example.

FIG. 2 is the multi-level leadframe 108. The height of the first level 111 of the leadframe is D1. The height of the second level 112 of the leadframe is D2. The height dimensions D1 and D2 are in a direction normal to a plane defined by the surface 103 of the die 102 to which the conductive posts 130 are attached. In one example, D1 is in the range of 0.05 mm to 0.2 mm, and D2 is in the range of 0.1 mm to 0.3 mm.

Figure 3:
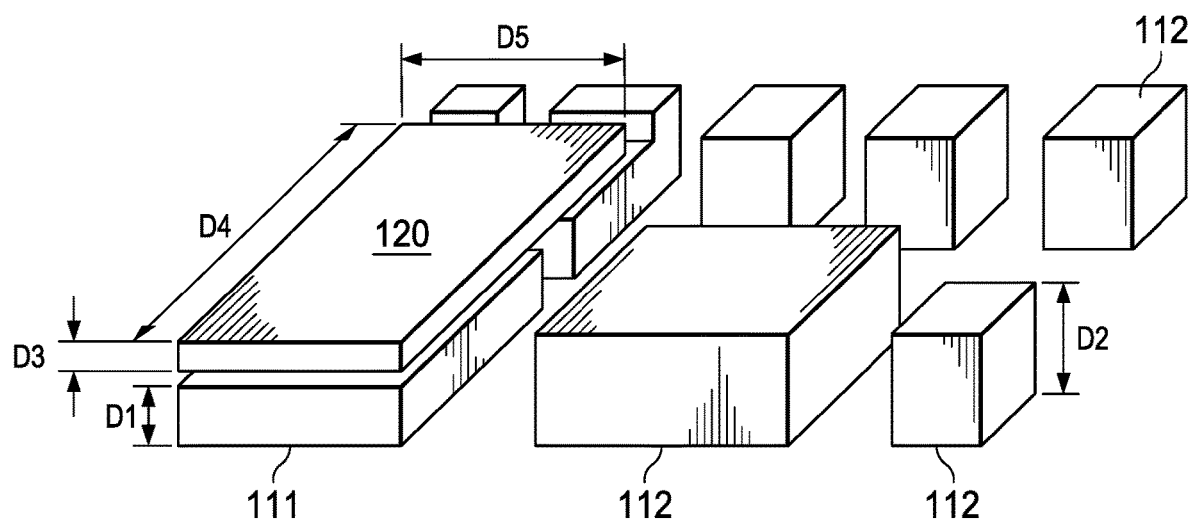
FIG. 3 is an interim configuration of the semiconductor device of FIG. 1 in which the current sense element is attached to the leadframe in accordance with an example.

The first level 111 of the leadframe forms a pocket into which the current sense element 120 is attached. FIG. 3 illustrates current sense element 120 attached to the first level 111 of the leadframe. The current sense element 120 may be bonded, glued, or attached by other suitable mechanisms to the leadframe 108. In one example, the current sense element 120 may be applied by a sputter process. If the current sense element 120 comprises MANGANIN®, the alloy may be cleaned with de-ionized water. Also, MANGANIN® may not sufficiently wet to solder in which case the alloy is plated with a solderable material such as nickel, palladium, copper, tin, or a combination of any two or more of nickel, palladium, copper, and tin. The height of the current sense element 120 is D3. In this example, D3 is less than or equal to the difference between D2 and D1 (D3<D2-D1). In one example, D3 has a height that is in the range of 0.5 mm to 0.2 mm.

Figure 4:
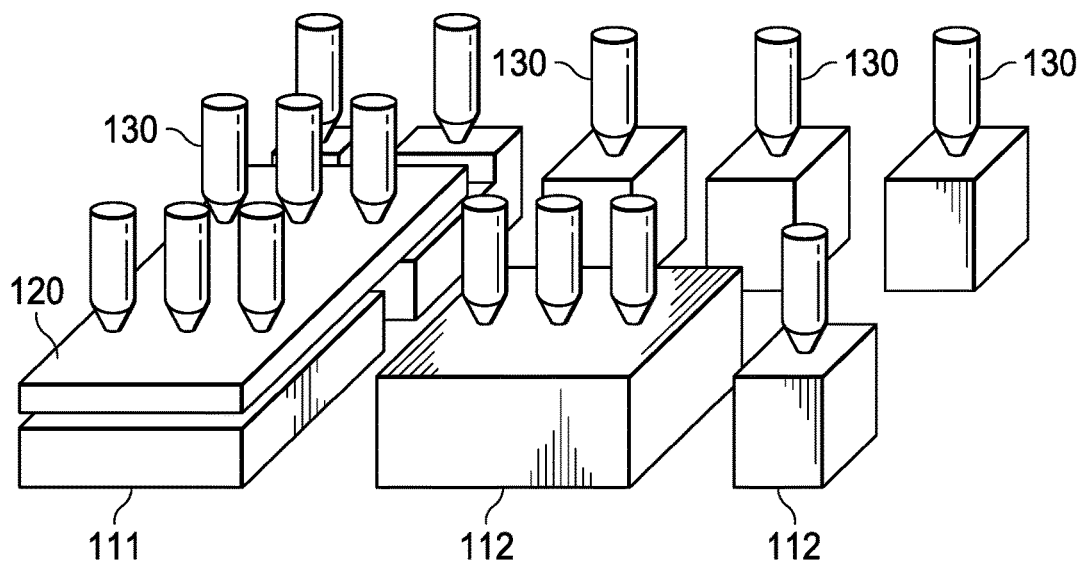
FIG. 4 is an is an interim configuration of the semiconductor device of FIG. 1 in which conductive posts are soldered to the current sense element and the leadframe in accordance with an example.

FIG. 4 illustrates the conductive posts 130 in an example relationship to the current sense element 120 as well as to the second level 112 of the leadframe. In one example, the conductive posts 130 are attached (e.g., electroplated) onto the semiconductor die 102 before the die/post combination is then attached to the leadframe 108. The semiconductor die 102 then may be attached (e.g., soldered) to the conductive posts 130 resulting in the semiconductor device 100 shown in FIG. 1. Mold compound (not shown) may be applied to the semiconductor device 100 resulting in a quad flat no-lead (QFN) package. However, the current sense element 120 described herein can be used in other types of semiconductor packages such as dual-in line packages, TSSOP packages, small outline integrated circuit (SOIC), quad flat package (QFP), ball grid array (BGA), or suitable packages.

Figure 5:
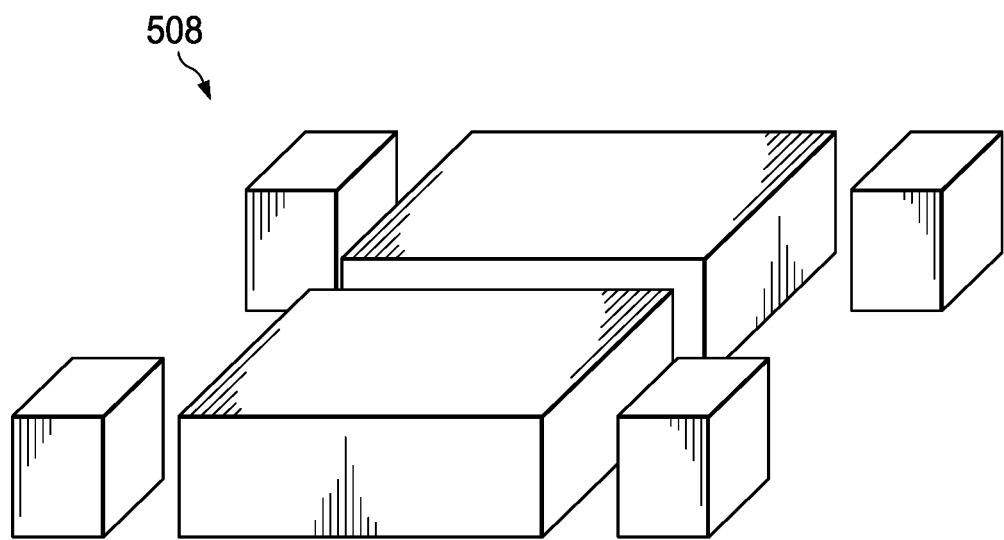
FIG. 5 is a single-level leadframe in accordance with an example.
Figure 6:
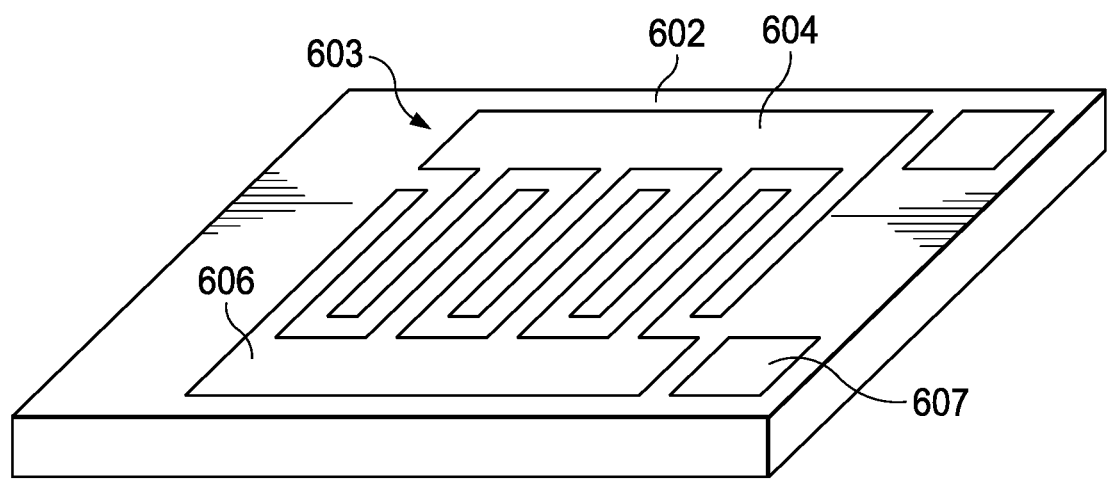
FIG. 6 is a semiconductor die in accordance with an example.

FIG. 1 is an example in which the current sense element 120 is a component separate from the die 102, and is coupled between the conductive posts 130 and the leadframe 108. In another example, the current sense element 120 is provided on the semiconductor die and is fabricated thereon during the manufacturing process of the die. FIGS. 5-9 show a sequence of manufacturing steps to fabricate a semiconductor device in which the current sense element is fabricated as part of the semiconductor die. FIG. 5 illustrates a leadframe 508. Whereas the leadframe 108 in FIGS. 1-4 is a multi-level leadframe, leadframe 508 is not necessarily a multi-level leadframe. For example, leadframe 508 may be a single-level leadframe. FIG. 6 illustrates a semiconductor die 602. The die 602 includes one or more transistors formed thereon. For example, FIG. 6 shows a transistor 603 comprising a drain 604 and a source 606. More than transistors may be included on die 602 as desired. The die also includes a connection pad 607. Source 606 has a larger area than connection pad 607 in this example.

Figure 7:
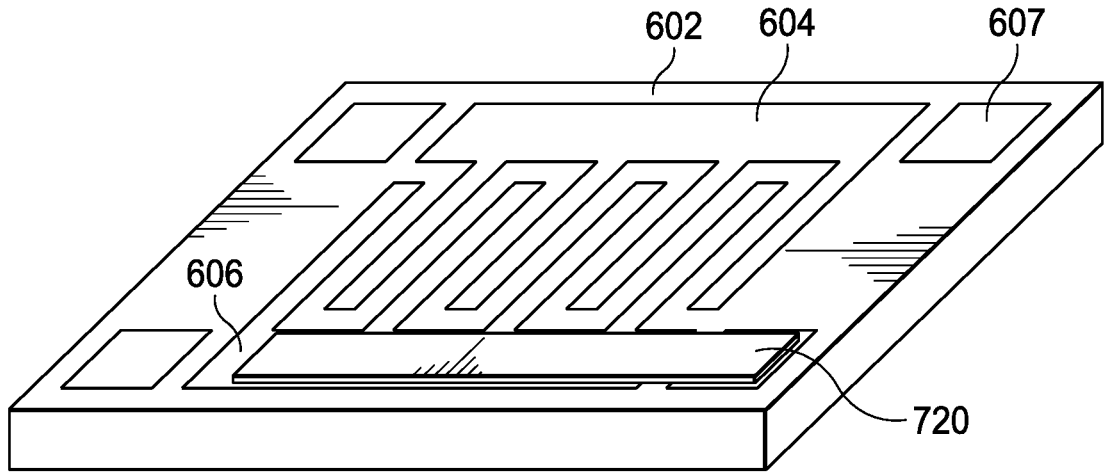
FIG. 7 is the semiconductor die in which a current sense element is integrated into the semiconductor die in accordance with an example.

FIG. 7 shows a current sense element 720 fabricated on the source 606. This process step may be implemented by, for example, a process such as sputtering, plating, evaporation, damascene, etc. of the current sense element material onto the die. The current sense element 720 is electrically coupled to the larger area source 606 and to the smaller area connection pad 607. The connection to the source 606 is used as a current force connection, and the connection to the smaller connection pad 607 is used as a sense connection. The current sense element 720 may be any of the materials descried above. For example, the current sense element 720 may be an alloy of copper (e.g., approximately 84.2%), manganese (e.g., approximately 12.1%), and nickel (e.g., approximately 3.7%). This alloy may be referred to as MANGANIN®. In another example, the alloy includes copper (approximately 55%) and nickel (approximately 45%), referred to as CONSTANTAN.

Figure 8:
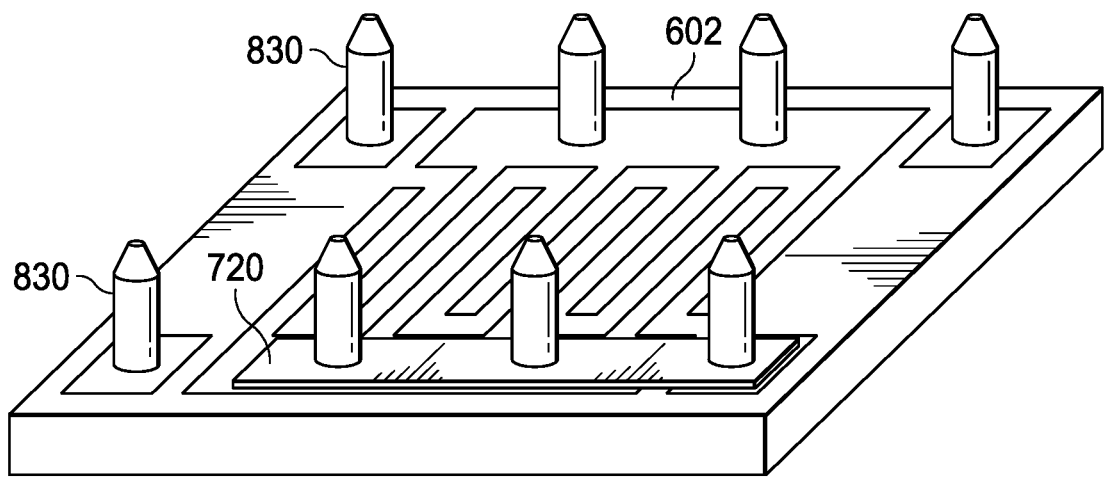
FIG. 8 is the semiconductor die with the integrated current sense element and conductive posts coupled thereto in accordance with an example.
Figure 9:
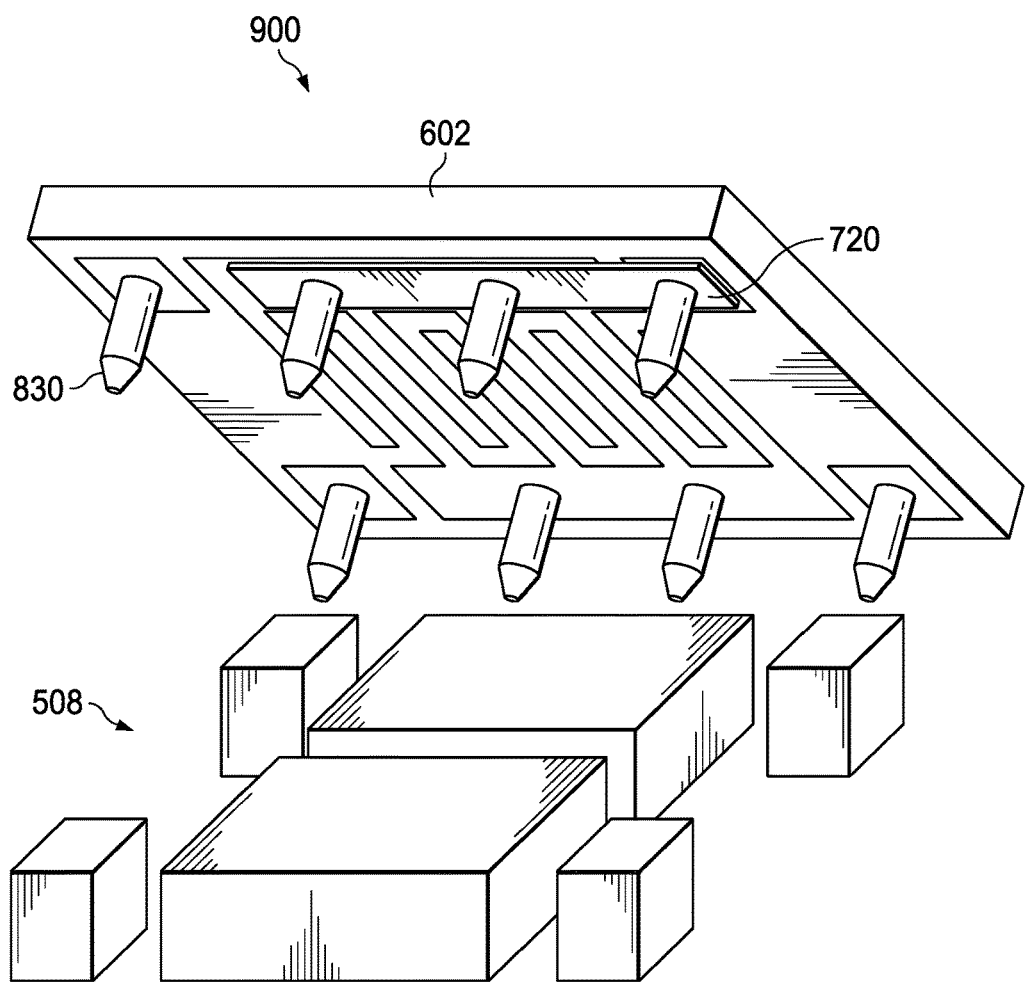
FIG. 9 is a semiconductor device with the integrated current sense element in accordance with an example.

FIG. 8 shows that conductive posts (e.g., copper posts) 830 are attached (e.g., electroplated) onto the die 602 as well as on to the current sense element 720. At least one post 830 is used as a current force connection, and at least one post is used as a sense connection. The semiconductor die 602 is then attached to the leadframe 508 as shown in FIG. 9. The current sense element 720 is part of the semiconductor die 602 and thus is positioned between the posts 830 and the semiconductor die 602. Mold compound (not shown) may be applied to form an IC package 900 as shown in FIG. 9. The package 900 may be a quad flat no-lead (QFN) package, or other types of packages as described above.

Figure 10:
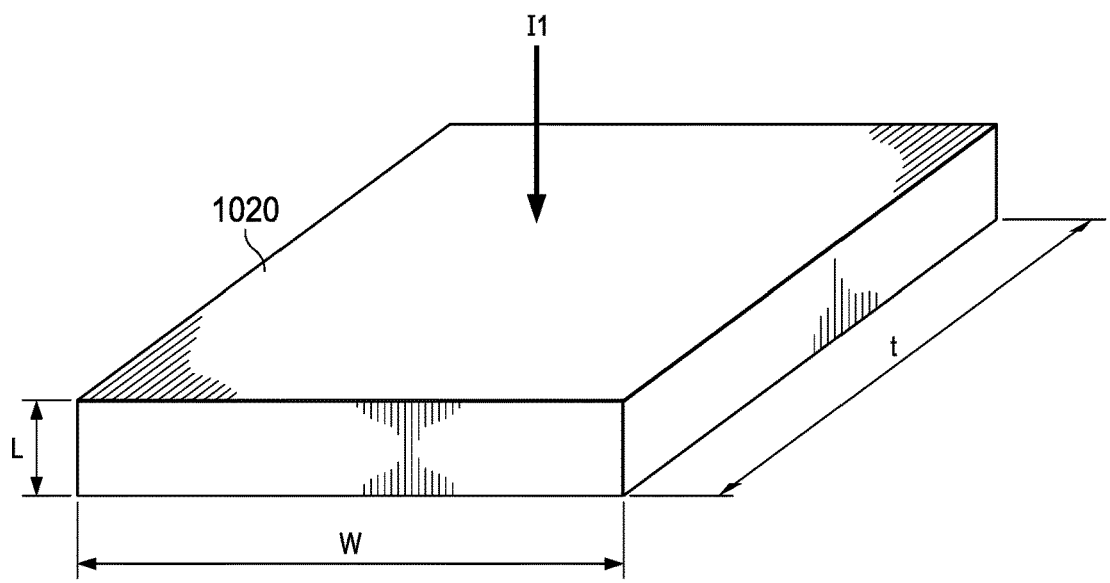
FIG. 10 is a current sense element in accordance with an example.

In one example (such as is shown in FIGS. 1, 3, 4, and 7-9), the current sense element 120 and 720 is a solid component having a particular resistance which is a function of its sheet resistance and physical dimensions. FIG. 10 shows an example of a current sense element 1020 (e.g., current sense elements 120 or 720) having dimensions L, W, and t. The dimension L is in the direction of the flow of current I1. Dimensions and W and t are in the orthogonal directions to the direction of current flow. The resistance (R) of current sense element 120 is:

$$R = \rho * L/A \qquad (1)$$

where ρ is the resistivity of current sense element 120, and A is the area of the current sense element in the plane orthogonal to the direction of current flow. The area A is given by W*t.

Figure 11:
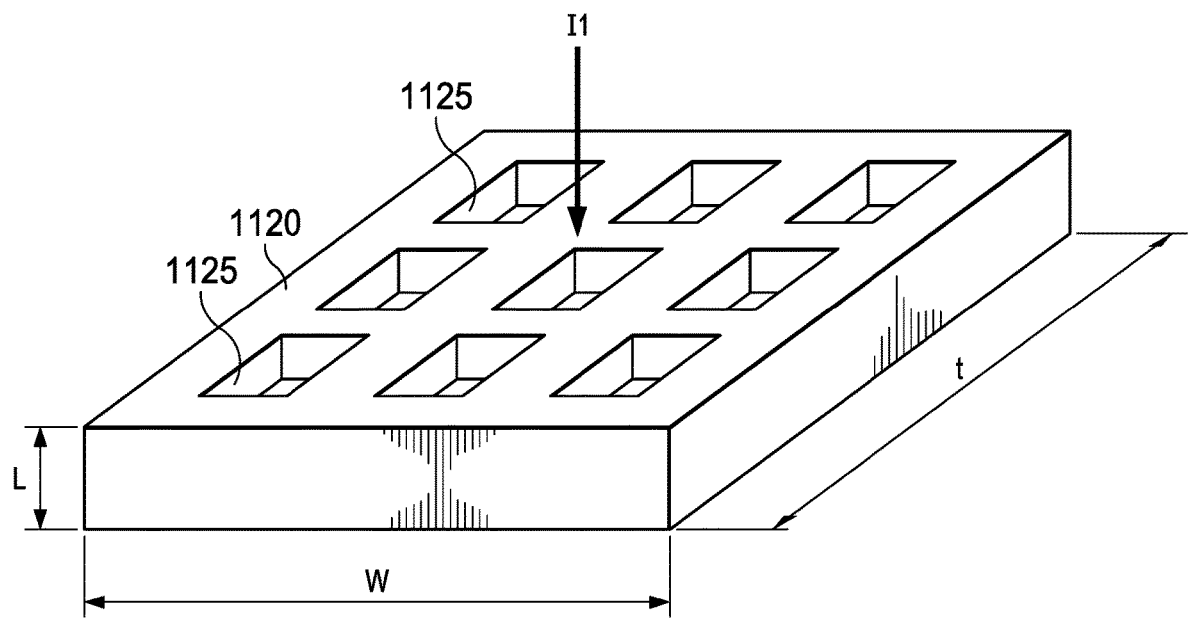
FIG. 11 is a perforated current sense element in accordance with an example.

FIG. 11 shows an example of a current sense element 1120 which is perforated as indicated by perforations 1125. The perforations 1125 reduces the area (W*t) of the current sense element in the plane orthogonal to the direction of current flow. All else being equal (same resistivity, same dimension L), the resistance of the current sense element 1120 in FIG. 11 will be larger than the resistance of the current sense element 1020 in FIG. 10. Accordingly, the resistance of the current sense element can be configured to a desired value by perforating the current sense element. In one example, during wafer fabrication or bumping, a perforated current sense element is created using a photolithography process.

Figure 12:
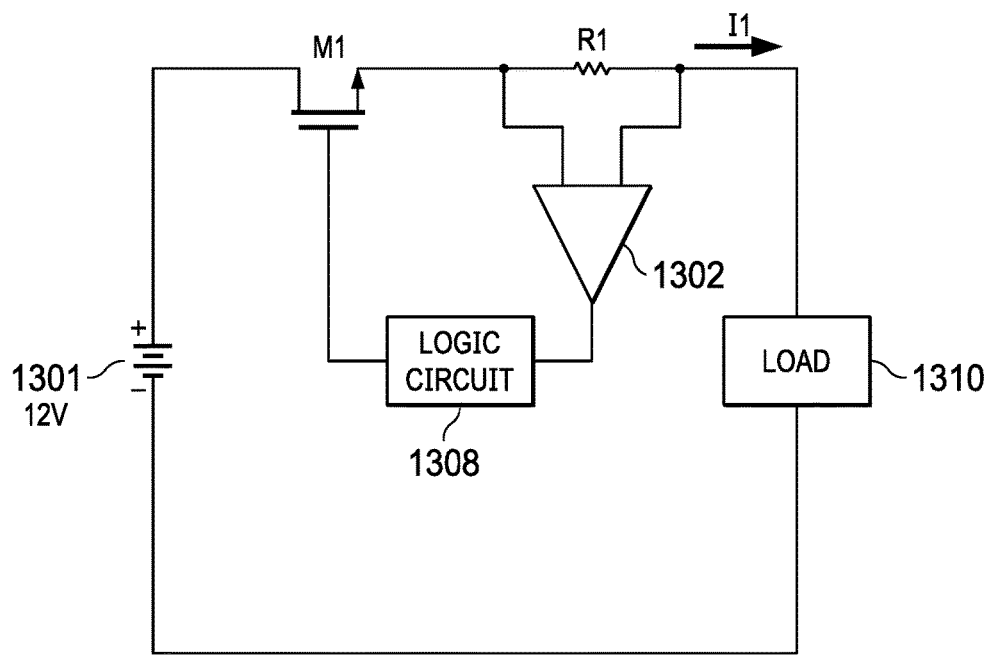
FIG. 12 is an example system using a current sense element as described herein.

FIG. 12 shows an example of the use of the current sense elements described herein. A transistor M1 is operable to provide current from a power source such as a battery 1301 to a load 1310. Resistor R1 is any of the current sense elements 120, 720, 1020, or 1120 described herein. Current I1 from the power source 1301 to the load 1310 flows through transistor M1 and resistor R1. The voltage across resistor R1 is provided to a buffer 1302, which then generates a single-ended signal to logic circuit 1308. Logic circuit 1308 includes, for example, an amplifier, a comparator, and a gate driver. The comparator compares the voltage from resistor R1 to a threshold voltage and, responsive to the voltage across resistor R1 being greater than the threshold voltage, the logic circuit 1308 causes transistor M1 to be turned off thereby providing current limiting protection. In another example, logic circuit 1308 may regulate the gate-to-source voltage (Vgs) of transistor M1 to provide a regulated amount of current to the load 1310.

Figure 13:
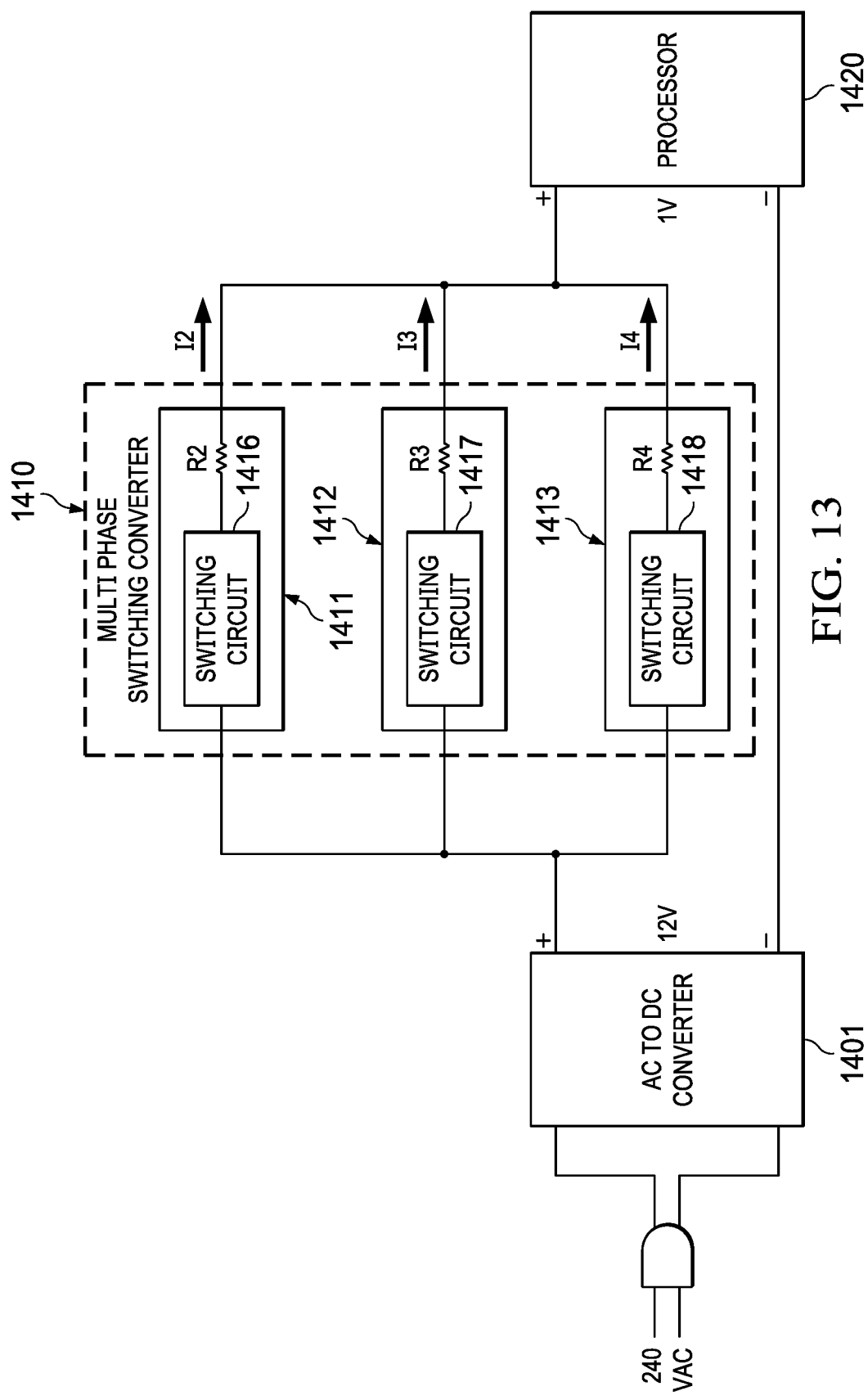
FIG. 13 is another example system using current sense elements described herein.

FIG. 13 is a block diagram of power generation system to provide a regulated voltage to a processor 1420 (or other type of load). An alternating current (AC)-to-direct current (DC) converter 1401 converts an AC input voltage (e.g., 240 VAC, 120 VAC) to a lower voltage DC voltage (e.g., 12 V). A multi-phase switching converter 1410 is coupled between the AC-to-DC converter 1401 and the processor 1420. In this example, the multi-phase switching converter 1410 includes three phases 1411, 1412, and 1413. Each phase 1411-1413 includes a switching circuit (1416, 1417, and 1418, respectively) and a sense resistor (R2, R3, and R4, respectively). Current (I2, I3, I4) through each phase 1411-1413 to the processor 1420 flows through the phase's sense resistor (R2, R3, R4).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

Modifications are possible in the described embodiments, and other embodiments are possible, within the scope of the claims.

What is claimed is:

1. A semiconductor device, comprising:
   a leadframe having a first level and a second level;
   a semiconductor die;
   a conductive alloy between the semiconductor die and the first level of the lead frame, the conductive alloy configured to be a current sense element;
   a first conductive post coupling the semiconductor die to the conductive alloy;
   a second conductive post coupling the semiconductor die to the conductive alloy, the second conductive post configured to be a first sense terminal; and
   a third conductive post coupling the semiconductor die to the second level of the lead frame, the third conductive post configured to be a second sense terminal.

2. The semiconductor device of claim 1, in which the conductive alloy is an alloy comprising copper, manganese, and nickel.

3. The semiconductor device of claim 1, in which the conductive alloy is an alloy comprising approximately 84.2% copper, approximately 12.1% manganese, and approximately 3.7% nickel.

4. The semiconductor device of claim 1, in which the conductive alloy is an alloy comprising copper and nickel.

5. The semiconductor device of claim 1, in which the conductive alloy is an alloy comprising approximately 55% copper and approximately 45% nickel.

6. The semiconductor device of claim 1, in which the conductive alloy has a temperature coefficient of approximately 0.000002/° C.

7. The semiconductor device of claim 1, in which the first and second conductive posts are attached to a surface of the conductive alloy, the surface is perforated.

8. The semiconductor device of claim 1, in which the semiconductor die includes a transistor having a terminal coupled to the first and second conductive posts.

9. The semiconductor device of claim 1, in which:
the first level of the leadframe has a first height;
the second level of the leadframe has a second height;
the conductive alloy has a third height; and
the third height is less than or equal to a difference between the second and first heights.

10. A semiconductor device, comprising:
a leadframe;
a semiconductor die having a transistor;
a current sense element coupled between the leadframe and the transistor by a first pair of conductive posts and a second pair of conductive posts, wherein the first pair of conductive posts are configured to supply a current to the current sense element, and the second pair of conductive posts are configured to sense a voltage.

11. The semiconductor device of claim 10, in which the current sense element includes an alloy comprising nickel and copper.

12. The semiconductor device of claim 10, in which the current sense element includes an alloy comprising nickel, manganese, and copper.

13. The semiconductor device of claim 10, wherein the first pair of conductive posts are force connections and the second pair of conductive posts are sense connections.

14. The semiconductor device of claim 10, in which the current sense element is perforated.

* * * * *